United States Patent [19]

Timko

[11] Patent Number: 5,107,203
[45] Date of Patent: Apr. 21, 1992

[54] SEALED UTILITY METER HAVING INTERNAL AUTOMATIC DISCONNECTION

[75] Inventor: Richard C. Timko, Duluth, Ga.

[73] Assignee: Schlumberger Industries Inc., Norcross, Ga.

[21] Appl. No.: 618,332

[22] Filed: Nov. 26, 1990

[51] Int. Cl.⁵ .............................................. G01R 11/24
[52] U.S. Cl. ................... 324/110; 324/157; 361/366
[58] Field of Search ............... 324/110, 142, 156, 157; 361/364, 366; 200/61.83; 320/62, 17; 206/328, 459; 340/637, 540

[56] References Cited

U.S. PATENT DOCUMENTS

| | | | |
|---|---|---|---|
| 3,263,892 | 8/1966 | Danyl et al. | 206/459 |
| 3,858,717 | 1/1975 | Peters | 206/459 |
| 4,039,943 | 8/1977 | Tapscott | 324/110 |
| 4,477,764 | 10/1984 | Pollard | 320/62 |

*Primary Examiner*—Vinh Nguyen
*Attorney, Agent, or Firm*—Sanford J. Asman

[57] ABSTRACT

A sealed utility meter having internal automatic disconnection. The meter contains a battery source of power for energizing the circuitry and is used in its operating environment in a horizontal position. In order to minimize battery drain prior to operation the meter is provided with a tilt switch mounted at a substantially 45° angle to horizontal to energize the meter when it is in its operating position and deenergize the meter when it is removed from that position. The meter is packed in a container with packaging material which determines the packed position of the meter and the packing carton is provided with indicia to indicate the proper shipping and storage orientation of the carton. When the meter is thus packed and the carton thus oriented the circuitry is deenergized.

16 Claims, 3 Drawing Sheets

SEALED UTILITY METER HAVING INTERNAL AUTOMATIC DISCONNECTION

TECHNICAL FIELD

The present invention relates generally to utility meters, and more particularly, to a solid state utility meter or to a solid state attachment to a mechanical or electromechanical meter manufactured as a sealed unit including the energizing battery.

BACKGROUND ART

Utility meters are commonly used by water, gas, and electric utilities to measure the flow of metered utilities between the supplying utility and the customer.

While the present invention is intended to be applicable to any type of utility meter which employs a battery powered solid state module, by way of example herein, electricity meters will be described. However, those skilled in the art will recognize that the present invention relates, also, to water and/or gas meters.

Within each electric meter there is a disk which acts as the rotor of a small electric motor coupled to the power line being measured. The disk rotates at a speed proportional to power flowing through the meter, and causes pointers to move to positions indicative of the amount of electric power used. The amount of power applied to or obtained from a load is accumulated by a register that is coupled mechanically to the disk. The register is read periodically by the utility for customer billing. To enable the utility to determine by inspection whether the meter is operative, whether power is flowing, and, if so, approximately at what rate and in what direction, a portion of the disk is exposed to be viewed from outside the meter.

Recently developed microprocessor controlled meters, currently being adopted by the electrical utilities, are able to carry out numerous metering functions, such as demand and time of use measurement, within a single meter.

Many such microprocessor controlled meters are now being provided as sealed pieces of equipment which include the battery for powering the circuitry of the meter. One difficulty that has become apparent with such meters, however, is the problem of insuring adequate battery life and preventing premature reduction of useful life during shipping and storage while maintaining the integrity of the meter's seal. While the manufacturer may control the manufacturing and shipping process and procedures to minimize battery drain, it has heretofore been impossible to control warehouse storage time.

There accordingly exists a need to provide in a solid state utility meter, which is subject to storage as a sealed unit, some type of mechanism which permits a maximum degree of preservation of useful battery life.

DISCLOSURE OF THE INVENTION

It is accordingly a primary object of the present invention to provide a solid state utility meter, assembled as a sealed unit, which contains a battery power supply including a mechanism for disconnecting the battery during shipping and storage.

It is another object of the invention to provide a solid state utility meter or solid state attachment to an electromechanical meter in the form of a sealed unit including the energizing battery, wherein the circuitry is deenergized during periods when the sealed unit is removed from an operating context.

It is another object of the invention to provide a solid state utility meter in the form of a sealed unit including the energizing battery, wherein the circuitry is deenergized during periods when the sealed unit is stored, such as in a warehouse.

It is still another object of the invention to provide a solid state utility meter of the foregoing type wherein the meter is so constructed, packaged, and stored as to provide for maximum deenergization of the meter prior to its entering an operating context.

It is yet another object of the invention to provide a solid state utility meter in the form of a sealed unit, including the energizing battery, wherein the meter is so constructed as to become energized only when placed in an operating orientation and deenergized when shifted from this orientation, which meter is packaged in a manner which insures to a maximum possible degree that warehousing occurs with the meter in a deenergized condition.

In accordance with these and other objects of the invention it has been discovered that improved battery life in a meter may be obtained when the meter which is the subject of the invention is shipped and warehoused in an orientation that is 90° from the required operating orientation and wherein this 90° shift in orientation is utilized in conjunction with the force of gravity to affect energization and deenergization of the involved circuitry.

It is thus another object of the invention to provide a process for constructing, shipping, and storing solid state utility meters in the form of a sealed unit including an energizing battery, wherein the meter includes a switching mechanism which is effective to disconnect the battery from the circuitry during shipment and storage in an orientation other than the operating orientation, wherein such shipping and storage is effected in a container so marked as to indicate the proper orientation for the packaged meter during shipping and storage.

In most instances in the United States the utility companies seal their own meters. In such situations, the utility can make the battery connection physically prior to installation. However, in many such cases circumstances result in the meter remaining sealed for long periods of time before installation. In other instances, applicable law requires that the meter be sealed by a government agent and that the seal not be broken by the utility. This may result in long storage prior to installation.

It is accordingly a principal object of the invention to provide an improved solid state utility meter in sealed form including a battery for powering the circuitry and connected to the circuitry through a gravity-sensing switching mechanism.

It is a further object of the invention to provide a solid state utility meter in a sealed housing including an energizing battery and switching mechanism which is effective to disconnect the battery from the circuitry during shipment and storage in an orientation other than the operating orientation.

It is another object of the invention to provide, in a shipping container having indicia to indicate proper orientation of said container, a solid state utility meter in a sealed housing including an energizing battery and switching mechanism which is effective to disconnect the battery from the circuitry during such time that said container is in the orientation indicated by said indicia.

These and further objects and features of the invention will become more apparent to those skilled in the art from the following description when read in conjunction with the accompanying drawing wherein there is shown and described a preferred embodiment of the invention simply by way of illustration of one of the best modes contemplated for carrying out the invention. As will be realized, the invention is capable of other, different embodiments, and its several details are capable of modification in various obvious aspects, all without departing from the invention. Accordingly, the drawings and descriptions will be regarded as illustrative in nature and not as restrictive.

BRIEF DESCRIPTION OF DRAWINGS

Referring to the Drawing.

BEST MODE FOR CARRYING OUT THE INVENTION

Figure 1:
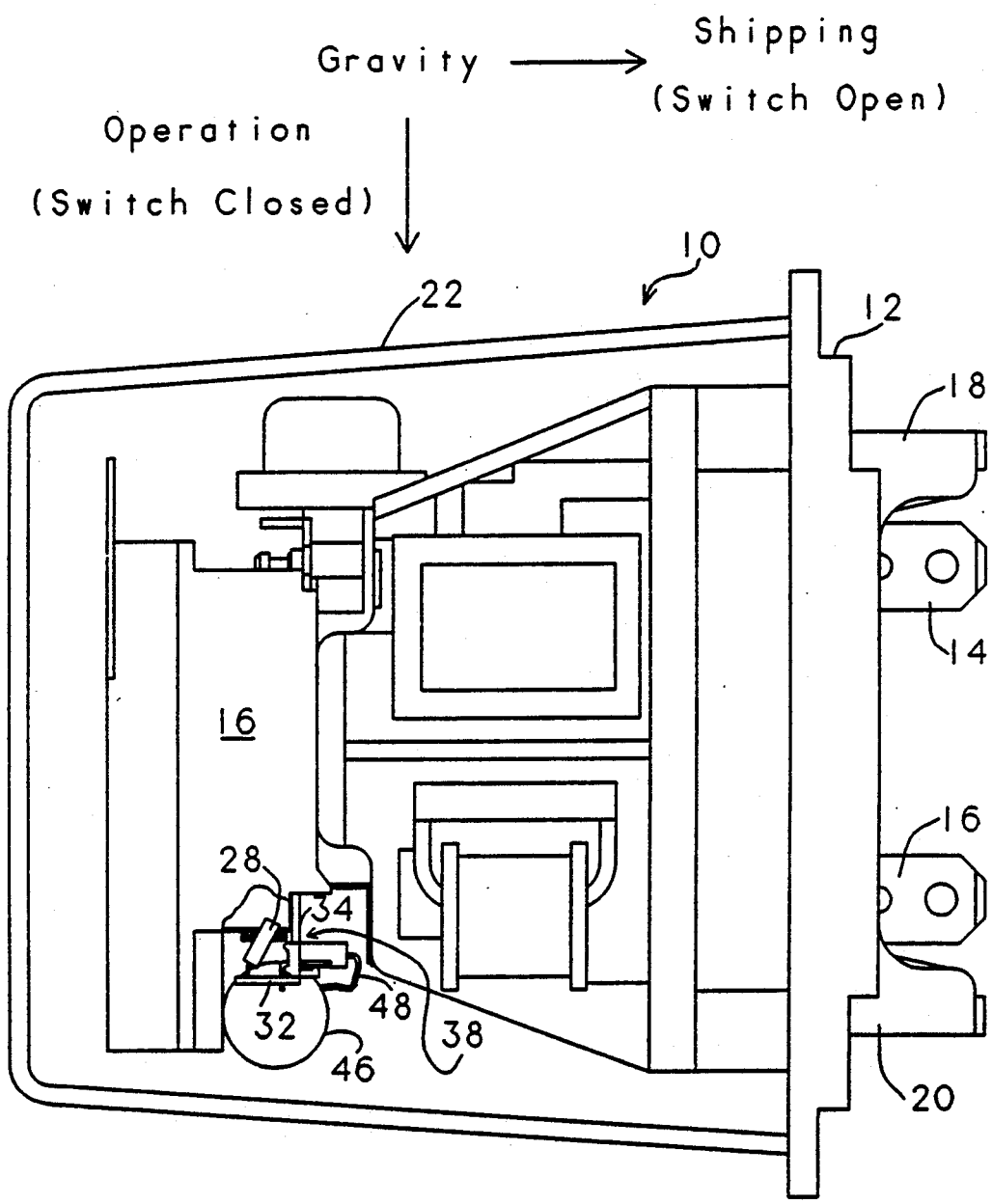
FIG. 1 is a side elevation, partly in section, showing a solid state electricity meter in a sealed housing including a glass cover and which includes a battery and switching mechanism shown in partial broken away vertical section.

Referring to FIG. 1, there is shown in side elevation and partial section an assembled power measuring assembly or electricity meter generally indicated at 10. While an electricity meter 10 is shown in the preferred embodiment of the invention, those skilled in the art will readily understand that the present invention is equally applicable to other utility meters, i.e., to gas and/or water meters, which contain a battery, or to battery operated solid state modules used in such utility meters. The meter 10 includes a basic measurement module 12 having the usual terminals 14, 16 and guides 18, 20. The operation portions of the meter 10 are covered by a conventional glass cover 22. A solid state register and display 16 is positioned to be readable through the glass cover 22. The meter 10 may be of the type described in U.S. Pat. No. 4,686,460 to Stevens et al., assigned to the predecessor of the assignee hereof.

The meter 10 is normally supported on a cabinet (not shown) that is attached to a support at the power measurement site. The guides 18, 20 and terminals 14, 16 are received within suitable apertures and connections in the cabinet. When it is mounted for operation, the meter 10 is in the position indicated in FIG. 1 which is herein referred to as a horizontal operating position. As used herein, the term "horizontal" is intended to refer to the position of the utility meter in its normal operating position, The force of gravity acts vertically downward in FIG. 1 as shown by the arrow at the top of FIG. 1 when the meter 10 is in the horizontal position.

Figure 2:
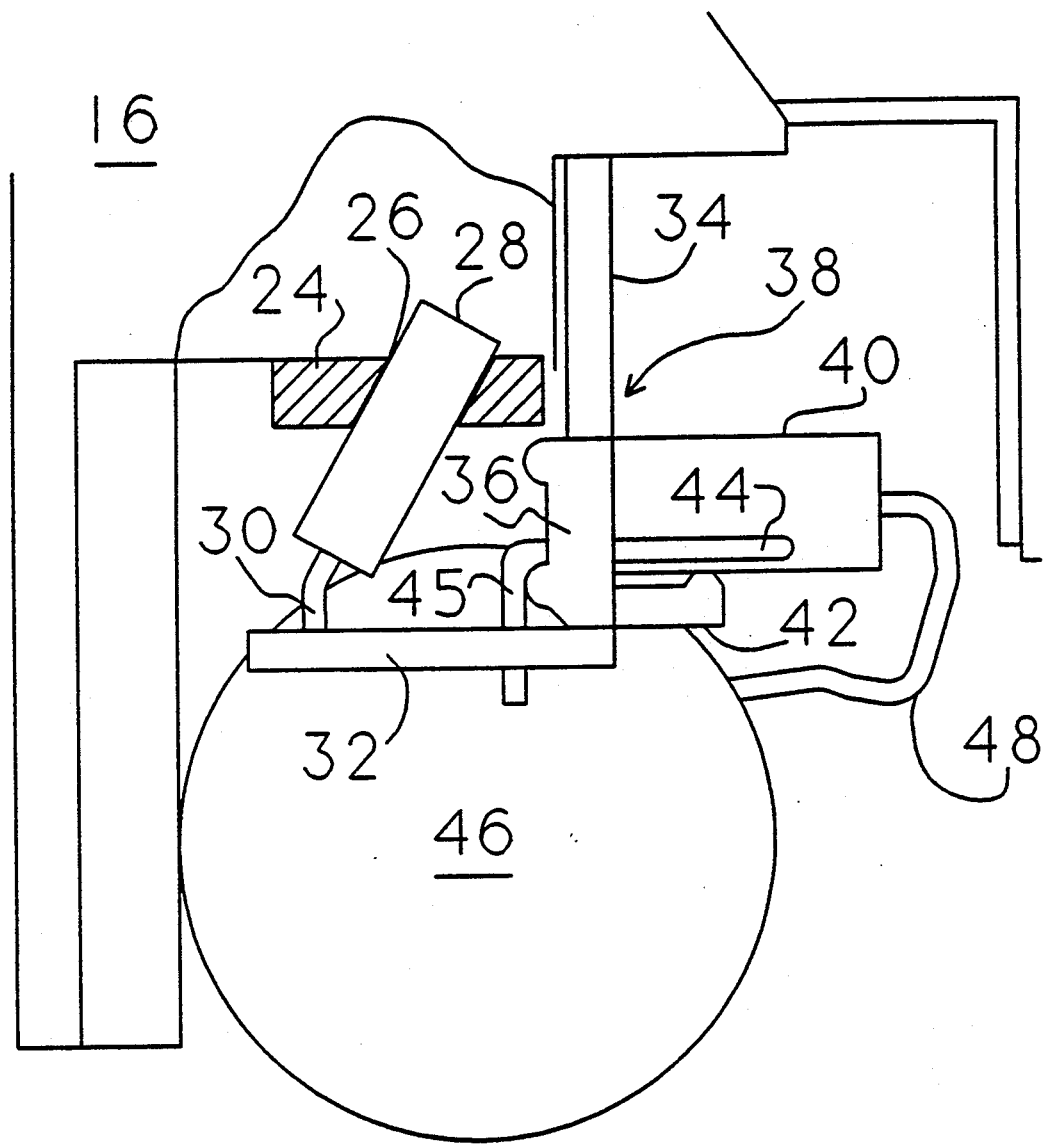
FIG. 2 is an expanded view of the battery and sectioned switching mechanism of FIG. 1.

Referring to the expanded, partially sectioned portion of FIG. 1, which is illustrated in FIG. 2, a tilt switch bracket 24 is provided in the lower portion of the housing of the register 16. A canted opening 26 extends through the bracket 24 at an angle to the horizontal surface of the bracket 24. This angle may preferably be about 45°. Mounted within the opening 26 in bracket 24 is a mercury or ball bearing tilt switch 28 of conventional type.

The terminals of the tilt switch 28 are connected by suitable leads 30 to a circuit board 32. The circuit board 32 may be secured to a bracket 34 which carries the male portion 36 of a disconnectable connector 38 having a female portion 40. A locking arm 42 secures the female portion 40 in position when the connector 38 is assembled as shown in FIG. 2. The pin 44 (shown in shadow) of the male portion 36 is connected to the circuitry on the circuit board 32 by a connector 45.

Figure 3:
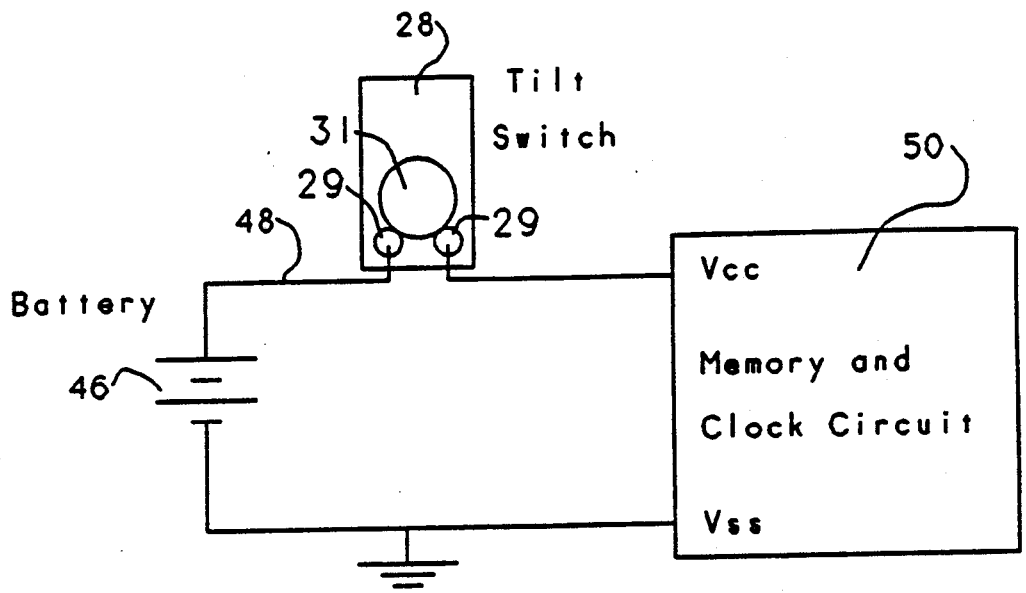
FIG. 3 is a schematic diagram of the circuit of the solid state electricity meter of FIGS. 1 and 2.

A conventional battery 46 is removably held beneath the register 16 by conventional battery clamps (not shown). The positive battery terminal is connected through a suitable conductor 48 to the female portion 40 of connector 38 to establish connection between the positive terminal of the battery 46 and circuit board 32. The negative terminal of the battery 46 is grounded in any suitable fashion to the circuitry (which is illustrated schematically in FIG. 3). The tilt switch 28, which comprises a pair of terminal means 29, which are electrically connected together by a moveable conductive member 31 which may be either a blob of mercury or a conductive ball bearing, is connected to the memory and clock circuit 50 which is contained within the register 16. Those skilled in the art will recognize that while the present invention describes powering an electrical meter's memory and clock circuitry 50, depending upon the particular measured utility being metered and the particular item(s) being battery powered, i.e., registers, clocks, and or RAM (memory), the present invention may be used to control circuitry different from that described herein, but for the same purpose, namely, to preserve battery life prior to the installation of the utility meter.

This connection of the battery 46 through connector 38 permits insertion and assembly of the battery 46 while, deferring the time of connection. That is, with respect to those purchasers who desire to themselves connect the battery 46 and seal the meter 10 it is possible to ship the meter 10 with the connector 38 in a disconnected condition with the connector portions 36 and 40 unplugged. However, since many such purchasers store the meters 10 for extended periods subsequent to connection and sealing, it is important that the gravity actuated switch 28 be in a disconnected condition during this storage time.

Figure 4:
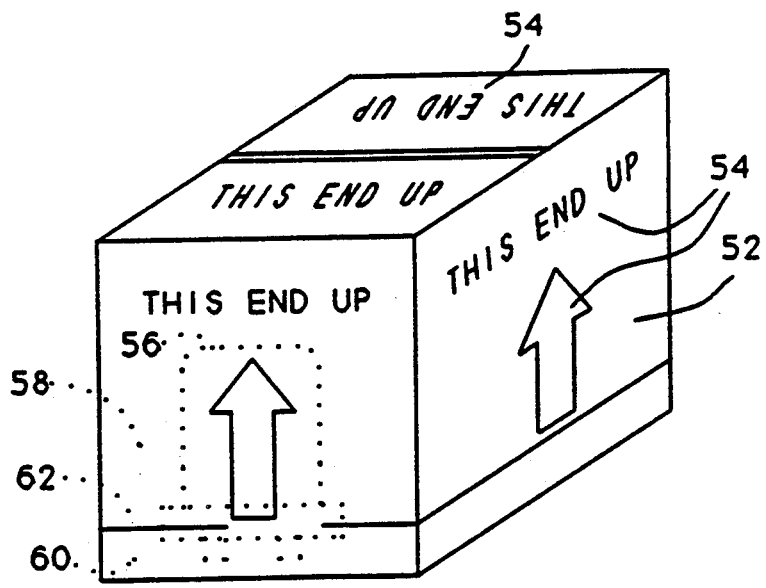
FIG. 4 is a perspective view of a container for shipping and storing the meter with the meter shown in phantom and illustrating the indicia which designates the proper orientation for the container.

Referring to FIG. 4, it is desirable to ship and store electricity meters 10 in an orientation that is 90° removed from the required operating orientation (when viewed from the side illustrated in FIG. 1). Such a shipping and storage orientation is depicted in phantom 56 in FIG. 4. Thus, a suitable shipping carton 52 is provided with indicia 54 indicating the desired handling and storage orientation of the carton 52. As will be understood, this shipping and storage orientation is 90° removed from the operating orientation of the electricity meter 10 shown in FIG. 1.

The meter 10 is held in the desired shipping and storage position by conventional packing and cushioning material. This may be provided in sections indicated at 58 and 60 in FIG. 4. The carton 52 may be opened, and the meter 10 may be removed by lifting the upper packing material section 58. The packing material sections 58, 60 may be formed of foamed plastic separated along a surface 62. The packing material sections 58, 60 are preferably formed with cavities sized and shaped to conform to the upper and lower portions of the meter 10. With this construction, the meter 10 will always be packaged in the position illustrated in FIG. 4. Thus, the meter 10 may be removed by the utility for sealing, and it may then be repackaged in the position indicated by the shape of the cavities in the packing members 58, 60. It will be appreciated that the illustrated packing arrangement using two members 58, 60 is not critical. It is merely necessary that the packing material be so shaped and disposed in the carton 52 as to permit access to the meter 10 and to then dictate the proper orientation for return of the meter 10 to the carton 52.

According to the invention, the tilt switch 28 is so disposed in the electricity meter 10 that the circuitry of meter 10 is actuated when the meter 10 is in its operating position, as shown in FIG. 1, and is deactivated when it is in its shipping and storage position, as indicated in FIG. 4. Since shipping and storage instructions, such as indicated by the indicia in FIG. 4 are generally observed in practice this results in the preservation of maximum battery energy until the meter 10 is actually installed in its operating position.

From the foregoing it will be seen that the construction and methodology of the invention provides an improved solid state electricity meter in sealed form including a battery for powering the circuitry and connected to the circuitry through a gravity sensing switching mechanism 28 which deenergizes the unit during periods when the meter 10 is removed from an operating orientation.

The foregoing description of the preferred embodiment of the invention has been presented for purposes of illustration and description and is not intended to be exhaustive or to limit the invention to the precise form disclosed, since many modifications and variations are possible in light of the above teaching. The embodiment was chosen and described in order best to explain the principles of the invention and its practical application, thereby to enable others skilled in the art best to utilize the invention in various embodiments and with various modifications as are suited to the particular use contemplated therefor. It is intended that the scope of the invention be defined by the claims appended hereto, when interpreted in accordance with full breadth to which they are legally and equitably entitled.

I claim:

1. In a utility measurement meter apparatus having a display register, a power supply, a measuring mechanism, and electrical circuitry defining functions performed by the meter apparatus, which meter is packed in a container for shipping or storage and subsequent to such shipping or storage removed from said container and mounted and connected in its operating position and orientation, the improvement comprising:
    (a) gravity actuated switch means mounted in said meter apparatus;
    (b) said gravity actuated switch means having terminal means and means to establish therebetween either a closed circuit condition or an open circuit condition dependent upon the orientation of said switch means relative to the force of gravity;
    (c) circuit means connecting said terminal means of said switch means between said power supply and the electrical circuitry of said meter apparatus so that said electrical circuitry is energized when said switch means establishes a closed circuit condition and said electrical circuitry is deenergized when said switch means establishes an open circuit condition;
    (d) said switch means being mounted in said meter apparatus to establish a closed circuit condition when said meter apparatus is disposed in its operating orientation to energize said electrical circuitry and to establish an open circuit condition when said meter apparatus is disposed in an orientation 90° removed from said operating orientation to deenergize said electrical circuitry;
    (e) indicia affixed to said container indicating a preferred orientation thereof;
    (f) said meter apparatus being packed within said container with an orientation substantially 90° removed from the operating orientation when said shipping container is oriented in the orientation indicated by said indicia whereby said meter apparatus is deenergized during shipment or storage and energized when mounted in its operating orientation.

2. A meter apparatus according to claim 1 wherein said container contains packing material means having a construction which defines an orientation for a meter apparatus received therein.

3. A meter apparatus according to claim 2 wherein said packing material means comprises multiple portions so disposed as to permit removal of said meter apparatus from said container without removal of all of said packing material means and wherein the remaining packing material means defines the orientation of said meter upon return to said container.

4. A meter apparatus according to claim 3 wherein said gravity actuated switch means includes a movable mass having an elongated axis of movement disposed substantially 45° from said operating orientation when said container is oriented in the orientation indicated by said indicia.

5. A meter apparatus according to claim 4 wherein said gravity actuated switch means is a mercury switch.

6. A meter apparatus according to claim 1 wherein said gravity actuated switch means includes a movable mass having an elongated axis of movement disposed substantially 45° from said operating orientation when said container is oriented in the orientation indicated by said indicia.

7. A utility measurement meter apparatus having a display register, a power supply, a measuring mechanism, and electrical circuitry defining functions performed by the meter apparatus, said meter apparatus having an operating orientation wherein an axis of said meter apparatus is substantially horizontal and substantially perpendicular to the force of gravity;
    (a) gravity actuated switch means mounted in said meter apparatus;
    (b) said gravity actuated switch means having terminal means and means to establish therebetween either a closed circuit condition or an open circuit condition dependent upon the orientation of said switch means relative to the force of gravity;
    (c) circuit means connected said terminal means of said switch means between said power supply and said electrical circuitry of said meter apparatus so that said circuitry is energized when said switch means established a closed circuit condition and is deenergized when said switch means establishes an open circuit condition;
    (d) said switch means being mounted in said meter apparatus to establish said closed circuit condition when said meter apparatus is disposed in its operating orientation to energize said electrical circuitry and to establish said open circuit condition when said meter apparatus is disposed in an orientation substantially 90° removed from said operating orientation to deenergize said electrical circuitry.

8. A utility measurement meter apparatus according to claim 7 wherein said gravity actuated switch means includes a movable mass having an elongated axis of movement disposed substantially 45° from the direction of the force of gravity.

9. A utility measurement meter apparatus according to claim 7 wherein said gravity actuated switch means is connected to said power supply through a disconnectable connector having disconnectable portions.

10. An utility measurement meter apparatus according to claim 9 wherein said connector comprises a plug type connector.

11. An utility measurement meter apparatus according to claim 10 wherein said plug type connector includes locking means for locking said disconnectable portions of said connector together.

12. A utility measurement meter apparatus according to claim 9 wherein a portion of said connector is carried by a bracket carried by said register.

13. A utility measurement meter apparatus according to claim 9 including circuit board means carried by said register and affixed to one portion of said connector, said terminal means of said switch means being connected to said circuit board.

14. A utility measurement meter apparatus according to claim 7 wherein said gravity actuated switch means is mounted in an aperture in bracket means carried by said register.

15. A utility measurement meter apparatus according to claim 7 wherein said gravity actuated switch is a mercury switch.

16. A utility measurement meter apparatus according to claim 7 wherein said gravity actuated switch is a ball bearing switch.

* * * * *